United States Patent [19]
Kang et al.

[11] Patent Number: 5,889,701
[45] Date of Patent: Mar. 30, 1999

[54] METHOD AND APPARATUS FOR SELECTING OPTIMUM LEVELS FOR IN-SYSTEM PROGRAMMABLE CHARGE PUMPS

[75] Inventors: Sunae Kang, Los Gatos; Rafael G. San Luis, Jr., San Jose; Derek R. Curd, Fremont; Ronald J. Mack, Gilroy, all of Calif.

[73] Assignee: Xilinx, Inc., San Jose, Calif.

[21] Appl. No.: 99,160

[22] Filed: Jun. 18, 1998

[51] Int. Cl.⁶ .................................................. G11C 16/04
[52] U.S. Cl. .......................... 365/185.18; 365/185.22; 365/185.29; 365/185.33; 365/218
[58] Field of Search .................... 365/185.18, 185.22, 365/185.23, 185.29, 185.33, 218, 226; 326/38

[56] References Cited

U.S. PATENT DOCUMENTS

| | | | |
|---|---|---|---|
| 4,638,464 | 1/1987 | Cranford, Jr. et al. | 365/226 |
| 5,537,362 | 7/1996 | Gill et al. | 365/189.11 |
| 5,661,685 | 8/1997 | Lee et al. | 365/185.22 |
| 5,734,868 | 3/1998 | Curd et al. | 326/38 |
| 5,764,076 | 6/1998 | Lee et al. | 326/28 |
| 5,790,469 | 8/1998 | Wong | 365/226 |

*Primary Examiner*—David Nelms
*Assistant Examiner*—Trong Phan
*Attorney, Agent, or Firm*—Lois D. Cartier; Adam H. Tachner, Esq.; Crosby, Heafey, Roach & May

[57] ABSTRACT

A novel test procedure is used to determine the optimum programmable charge pump levels for a flash memory array in a CPLD. According to the method of the invention, an automated tester steps through all combinations of charge pump codes and attempts to program the flash memory with each combination of voltage levels. For each combination, the results of the test (pass or fail) are logged and stored into a map or array. The center of a window of passing pump codes is taken as the starting reference point. The next step is to verify the actual voltage level associated with the pump code combination corresponding to the starting reference point. The reference pump code is loaded into the device and the corresponding flash memory cell voltage levels are measured. If the measured voltage level does not fall into the preferred range, the tester automatically adjusts the level towards the preferred range by adjusting the pump codes.

23 Claims, 5 Drawing Sheets

PROGRAM

ERASE

VERIFY

TO FIG. 3B

METHOD AND APPARATUS FOR SELECTING OPTIMUM LEVELS FOR IN-SYSTEM PROGRAMMABLE CHARGE PUMPS

FIELD OF THE INVENTION

This invention relates to complex programmable logic devices (CPLDs), and in particular, to a method of increasing test yields of CPLDs by optimizing voltage levels provided by the CPLDs' charge pumps used to program, erase, and verify the CPLDs.

BACKGROUND OF THE INVENTION

CPLDs are well-known integrated circuits that may be programmed to perform various logic functions. Numerous types of memory elements may be used in CPLD architectures to provide programmability. One such memory element, known as a flash memory cell, is both electrically erasable and programmable. Program and erase are performed on a plurality of flash memory cells using either Fowler-Nordheim (F-N) Tunneling or hot electron injection for programming and F-N Tunneling for erase. Flash memories can also be In-System Programmable (ISP). An ISP device is a device that can be programmed, erased, and verified after it has been connected, such as by soldering, to the system printed circuit board. Some CPLDs don't have ISP capability and must be programmed externally (outside the system) by programming equipment.

ISP CPLDs typically have two test modes: external mode and ISP mode. External mode requires special test equipment that can externally supply the high-level voltages required to program, erase, and verify the device. In ISP mode, internal charge pumps generate the high-level voltages from the operating voltage, and no special equipment is required. Some CPLDs use programmable charge pumps to generate the voltages needed for programming, erasing, and margin verifying during ISP. Such programmable charge pumps are well known. Lee et al describe a number of illustrative programmable charge pump circuits in U.S. Pat. No. 5,661,685, entitled "Programmable Logic Device with Configurable Power Supply", and assigned to Xilinx, Inc., the assignee of the present invention. U.S. Pat. No. 5,661,685 is incorporated herein by reference.

Programmable charge pumps are designed to be adjustable so that voltage levels can be changed to compensate for process variations during fabrication, which can cause shifts in the output voltage of the charge pumps. Application of very accurate voltage levels during programming, erasing, and verifying operations is critical to the success of programming or erasing a cell. For example, to program a cell in one well-known type of CPLD, voltages are applied to the wordline (gate) of the cell as well as the cell's bitline (drain). During erase, a voltage is applied to the source side of the cell to induce tunneling of the electrons off of the floating gate. Because of the importance of these voltage levels during operation, it is critical that optimum voltage levels are set in the device. Using optimum voltage levels ensures reliability of the device and optimum programming and erase times for the user.

Process variations alter the CPLD internal voltage levels from batch to batch. Thus, CPLDs processed within a single fabrication batch may work well at specified voltage levels, while CPLDs made in other batches do not necessarily work at the same voltage levels. More specifically, CPLDs made in other fabrication batches may not work well at the initially specified voltages, and yield may be considerably lower.

Process variations may affect charge pump accuracy from batch to batch, as well as affecting optimum voltage levels for programming, erasing, and verifying the device. Therefore, there is a need for a method of determining optimum charge pump settings for a particular batch of CPLDs, and using these optimum settings for CPLDs within the batch to maximize yield.

SUMMARY OF THE INVENTION

The present invention provides a method to program a programmable charge pump to provide optimum program, erase and verify voltages for flash memory or other memory arrays. In accordance with the present invention, programmable pump sources are provided for program, erase and verify operations. The individual charge pumps are programmed (coded) based not only on which set of pump codes will provide ISP functionality, but also which pump codes will provide optimum ISP functionality. This optimum programming is accomplished by running the programmable charge pumps through all combinations of voltage levels during programming, erase, and verify, and monitoring the yield results. A standard mainframe tester, an Automated Testing Equipment (ATE), is programmed to follow the method of the present invention. This method allows for fast, custom determination of optimum voltage levels to be used in each of the CPLD charge pumps. These optimum voltage levels are then permanently programmed into the device. In other embodiments, the method of the invention is applied to only one or two of the program, erase, and verify procedures.

In one embodiment, four charge pumps (wordline (gate), bitline (drain), source, and verify) each have 16 possible levels. The ATE goes through all combinations of charge pump codes and attempts to program one byte in the flash memory array for each combination. For each combination, the results of the test (pass or fail) are logged and stored into a RAM array. The data is then post-processed into a file that maps the passing pump code combinations. The center of a "window" of passing pump codes is taken as the starting reference point.

The next step in the process is to verify the actual voltage level associated with the code combination corresponding to the starting reference point. Each charge pump has a preferred voltage range for ISP performance. The reference code is loaded into the device and the corresponding voltage levels are measured. If the voltage levels do not fall within the preferred range, the ATE automatically re-adjusts the voltage level by adjusting the pump codes.

A particular set of voltage levels may work well for one fabrication lot of CPLDs as far as yield for ISP is concerned, yet yield poorly for another. The method of the invention allows for the maximization of ISP yield by optimizing the level used for each fabrication lot or batch or even for each device if desired.

BRIEF DESCRIPTION OF THE DRAWINGS

The present invention is illustrated by way of example, and not by way of limitation, in the following figures, in which like reference numerals refer to similar elements.

DETAILED DESCRIPTION OF THE DRAWINGS

Figure 1A:
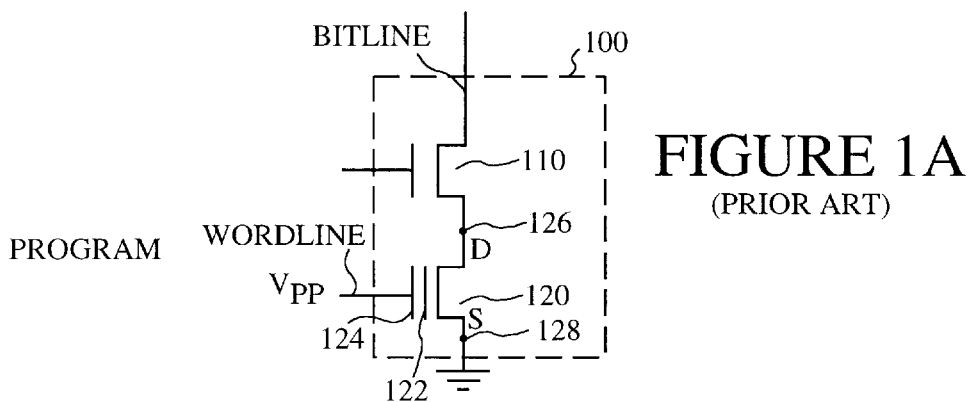
FIGS. 1A, 1B, and 1C show the voltage levels used to program, erase, and verify (respectively) a basic flash memory cell.
Figure 1B:
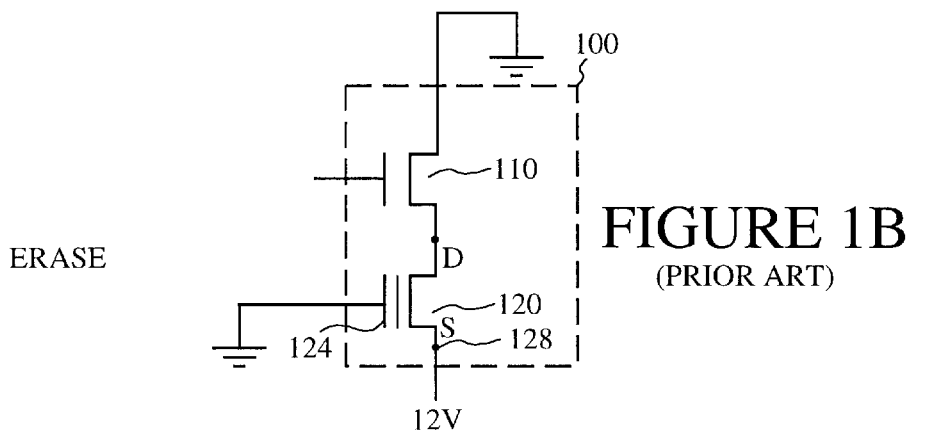
Figure 1C:
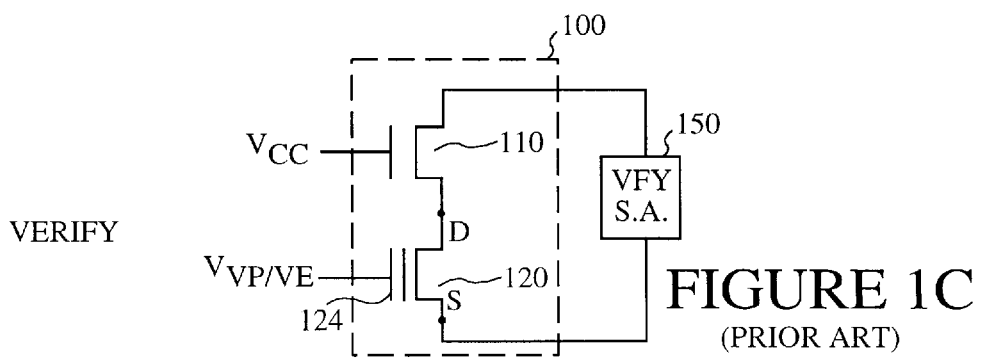

FIGS. 1A–1C show a basic flash memory cell 100. Flash memory cell 100 includes an access transistor 110 and a double-polysilicon storage transistor 120. Storage transistor 120 has a floating polysilicon gate 122 that is isolated by silicon dioxide and capacitively coupled to polysilicon control gate 124. Storage transistor 120 also has a region of silicon dioxide between floating gate 122 and a source 128 that is thin enough to permit electrons to tunnel to and from floating gate 122 when the proper bias voltages are applied to the terminals of storage transistor 120.

Referring to FIG. 1A, storage transistor 120 is programmed by grounding its source 128, applying a voltage of approximately 6 volts to its drain 126 (via the associated bitline), and connecting its control gate 124 (wordline) to a programming voltage Vpp that is high relative to the integrated circuit's operating voltage, Vcc. Typical values of programming voltage Vpp and operating voltage Vcc are ten volts and five volts, respectively. With storage transistor 120 thus biased, electrons travel through the tunnel oxide to floating gate 122, leaving floating gate 122 with a net negative charge. This net negative charge shifts the threshold voltage Vt, i.e., the voltage at which storage transistor 120 begins to conduct, in the positive direction to a voltage greater than Vcc.

As shown in FIG. 1B, storage transistor 120 is erased by grounding control gate 124 and applying a relatively high voltage, approximately 11 volts, to source 128. This bias allows electrons to tunnel away from floating gate 122 through the tunnel oxide to be swept away by the high positive voltage on source 128. The loss of electrons on floating gate 122 shifts the threshold voltage Vt of storage transistor 120 in the negative direction to a voltage that is less than Vcc.

When erasing storage transistor 120, it is possible to remove too many electrons from floating gate 122, thereby resulting in excess positive charge on floating gate 122. This condition is commonly known as "over-erase." Access transistor 110 is provided to prevent storage transistor 120 from conducting in the event that it is over-erased.

When the CPLD operates as a logic device, each of the storage transistors 120 has voltage Vcc applied to its control gate 124. The state of each storage transistor may then be read by determining whether the storage transistor conducts. If the storage transistor is programmed, voltage Vcc is less than the threshold voltage Vt so the storage transistor does not conduct. If the storage transistor is erased, voltage Vcc is sufficient to turn on the storage transistor.

After flash memory cell 100 is programmed or erased, a test is generally performed to verify its state. Referring to FIG. 1C, a verify-program voltage Vvp is applied to control gate 124 to determine whether the threshold voltage Vt is sufficiently high to keep storage transistor 120 from conducting when voltage Vcc is applied to control gate 124. The verify-program voltage Vvp is greater than voltage Vcc by a safety factor of, for example, 3 volts. This safety factor allows for noise and for a possible negative shift of the threshold voltage Vt caused by electrons escaping from floating gate 122 over the life of memory cell 100.

When the programmed or erased state of storage transistor 120 is verified, voltage Vcc is applied to the control gate of access transistor 110 to turn on access transistor 110. A sense amplifier 150, coupled across the series-connected access transistor 110 and storage transistor 120, determines whether storage transistor 120 conducts. If threshold voltage Vt is sufficiently high, over eight volts for example, a verify-program voltage Vvp does not turn storage transistor 120 on. As a result, sense amplifier 150 does not sense current through series-coupled transistors 110 and 120.

After storage transistor 120 is erased, the state of erasure may be verified by ensuring that it conducts with a low threshold voltage margin (Vve in FIG. 1C) applied to control gate 124. This erase threshold margin value is about 2 volts. Voltage Vcc is then applied to the gate of access transistor 110 to allow sense amplifier 150 to access storage transistor 120. If storage transistor 120 is properly erased, verify sense amplifier 150 detects a current through series-coupled transistors 110 and 120.

Figure 2:
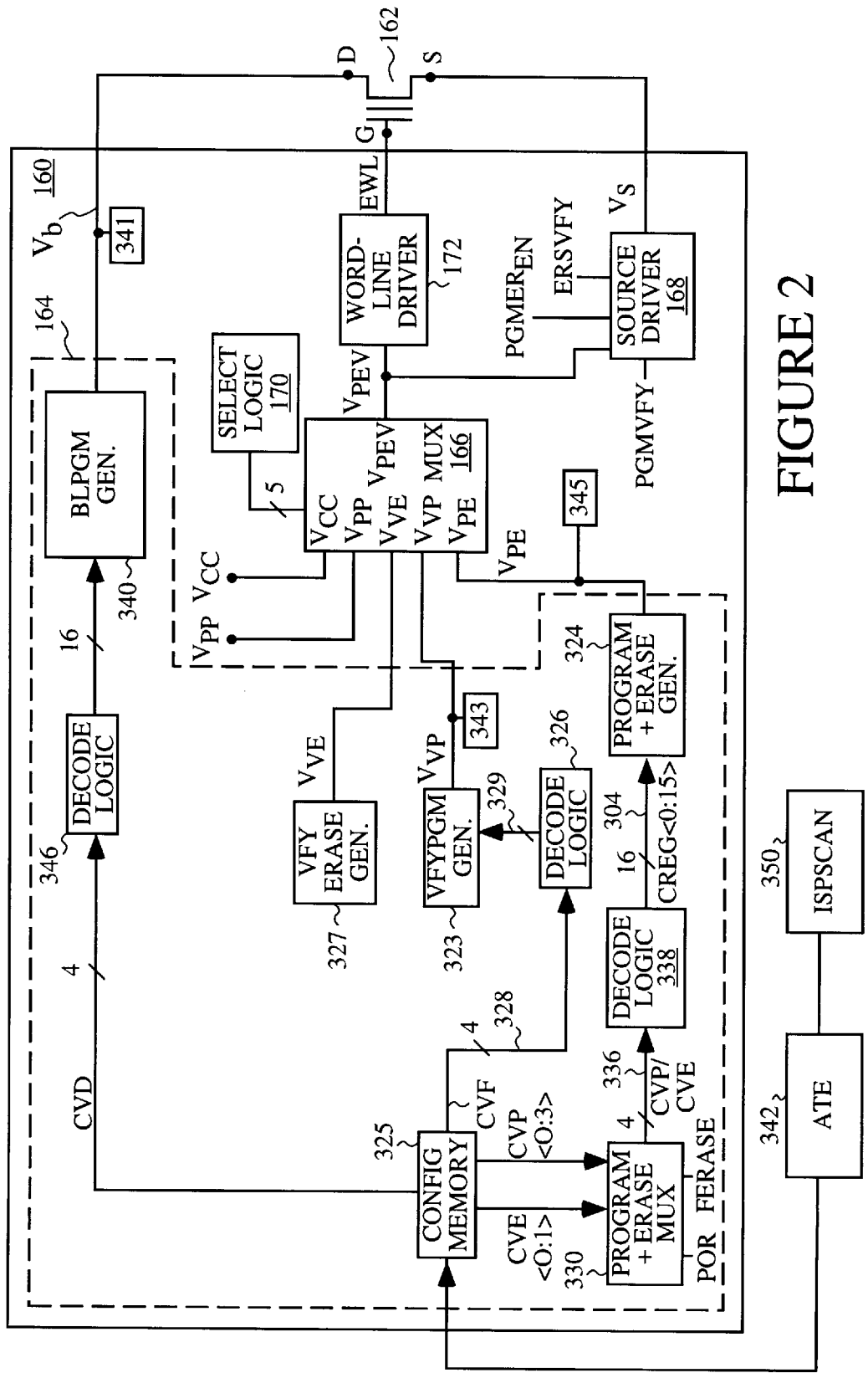
FIG. 2 is a block schematic diagram of a circuit used to optimally program charge pumps for flash memory arrays according to the method of the invention.

FIG. 2 shows a program/erase/verify circuit 160 in accordance with one embodiment of the present invention coupled to a flash storage transistor 162. Circuit 160 includes an internal voltage source 164 that provides a verify-erase voltage on terminal Vve, a verify-program voltage on terminal Vvp, and program/erase voltages on a terminal Vpe to multiplexer 166. Multiplexer 166 is also coupled directly to a pin Vcc and to an external pin Vpp that is used to supply external program and verify voltages. A bitline voltage Vb is also provided by circuit 160.

Voltage select logic 170 is coupled to five select input terminals of multiplexer 166, and serves to forward a selected one of the five input voltages to output terminal Vpev, depending on the operating mode of the CPLD. Thus, multiplexer 166 in combination with select logic 170 serves as a switch for providing any one of the voltages available on terminals Vcc, Vpp, Vve, Vvp and Vpe to output terminal Vpev.

The selected output signal of multiplexer 166 on terminal Vpev (e.g., a program, erase, or verify voltage) is fed to an input terminal of a wordline driver 172 and to a source driver 168. Wordline driver 172 drives wordline EWL, which is coupled to the gate G of flash storage transistor 162, while source driver 168 drives the source S of flash storage transistor 162 when the CPLD is in either program or erase mode. A bitline voltage Vb is provided by bitline charge pump 340 and is used during programming operations. The remaining description of FIG. 2 describes the aspects of circuit 160 that are relevant to the present invention. A further description of circuit 160 is set forth in U.S. Pat. No. 5,661,685 identified above.

Circuit 160 includes four adjustable charge pumps. The wordline and erase charge pumps are designated in FIG. 2 as PROGRAM & ERASE GEN 324. The verify charge pump is designated VFYPGM GEN 323 and the bitline charge pump is designated BLPGM GEN 340. The wordline and bitline charge pumps are used during programming; the erase charge pump is used during erase; and the verify charge pump is used during the verify operation to determine the verify margin level, as explained above.

The level of each charge pump is set by a control code (pump code). The pump code that determines the voltage level on the wordline during programming is called CVP; the pump code that determines the voltage level of the bitline during programming is CVD; the pump code that determines the level of the source during erase is CVE; and the pump code that determines the program verify margin level is CVF. The lines carrying these codes are labeled in FIG. 2 with the names of the corresponding codes.

In the embodiment of FIG. 2, each of charge pump generators 324, 340, and 323 has 16 possible voltage levels. During programming, charge pump 324 is configured by program and erase multiplexer 330 to set the wordline voltage. Bitline charge pump 340 sets the bitline voltage. Since each of charge pumps 324 and 340 can be set to 16 levels, a total of 256 combinations (16×16) are possible under programming conditions. One programmable charge pump suitable for each of the charge pumps used herein is described in detail in U.S. Pat. No. 5,661,685 identified above. In particular, reference is made to FIGS. 10A, 10B, and 10C and the description thereof in the referenced patent.

The conventional mainframe automated test equipment (ATE) device 342 loads the appropriate CVP, CVD, CVE and CVF codes into RAM configurable memory 325. Operation of ATE 342 is controlled by a software routine, ISP-SCAN 350. The ISPSCAN routine is preferably C-based and totally automated when used with a mainframe ATE. During programming operations, decode logic circuit 346 responds to the CVD code to set the bitline charge pump 340 level while decode logic circuit 338 responds to the CVP code, selected by program & erase multiplexer 330, to set the wordline charge pump 324. Multiplexer 330 sends out the CVE code to decode logic circuit 338 for erase operations. Decode logic circuit 326 responds to the CVF code to set the voltage level of verify charge pump 323.

ISPSCAN routine 350 determines which combination of voltage levels is optimum for programming, erasing, and verifying each lot or batch sample device. Once the initial codes are determined, ISPSCAN routine 350 uses transceiver pads 341, 343, and 345 to measure the voltage level of each pump internally. (Transceiver pads 341, 343, and 345 are probe pads that are not bonded out at the package level; therefore they can only be accessed during wafer test.) The routine then loads the determined codes and measures each voltage level to ensure that the level falls within the expected voltage range. For example, in one embodiment of the invention the expected wordline voltage Vpe, which is supplied by charge pump 324 and used for programming, is normally between 10 and 11 volts. For abnormal fabrication lots, the level may be dramatically out of this range, which would decrease yields if prior art methods were used. Using the method of the present invention can save many CPLD devices by programming CPLDs which, because of fabrication variations, require pump voltage levels different from design levels.

The operation of ISPSCAN routine 350 is described with reference to the flow diagram of FIGS. 3A and 3B. Step 352 signifies the start of a program operation. At step 354, one combination of charge pump codes CVP (wordline code) and CVD (bitline code) is loaded into RAM configurable memory 325. This loading step sets charge pumps 324 and 340 to corresponding levels, respectively, as indicated at step 356. At step 358, selected flash storage transistors 162 are programmed in-system. Next, at step 360, sample flash memory bits are checked to see whether they have been programmed successfully. The pass/fail result is compiled into an array or map, as shown in FIG. 4. At step 362, each of the possible combinations of bitline and wordline levels is performed and checked.

The optimum codes CVP and CVD for wordline charge pump 324 and bitline charge pump 340 are determined from the array logged for the 256 combinations tested in steps 354–362. This process is best understood by referring to FIG. 4, which shows the fail/pass map 400 for 9 CPLD devices programmed and tested according to the invention. The numbers on the map indicate the number of CPLD devices that passed for a given combination of wordline and bitline codes. A "dot" indicates that no devices passed for that particular code. The x-axis is the CVD code for the bitline, and the y-axis is the CVP code for the wordline.

The optimum codes are those in which all nine of the devices passed in map 400 of FIG. 4. This case is indicated by those locations with "9". The center of the "window" of maximum passes is taken to be the starting reference point. In the example of FIG. 4, the center is around 11 or 12 for both the wordline code CVP and the bitline code CVD.

Next, at step 366 (FIG. 3A), the flash storage transistors 162 are erased. Select logic 170 provides external voltage Vpp (FIG. 2) to selected flash storage transistors. This external voltage allows the initiation of the verify portion of the method of the invention, which is shown in FIG. 3B.

At step 368 (FIG. 3B) ISPSCAN routine 350 loads the first possible CVF (verify) code into RAM configurable memory 325, and at the same time sets the wordline and bitline levels determined to be optimum at step 364. At step 370, decode logic circuit 326 sets the level for verify charge pump 323. Decode logic circuits 338 and 346 set the levels for the wordline and bitline charge pumps, respectively. The flash memory cells are then programmed and verified in ISP mode. Next, at step 372, to guarantee that the internal verify levels coincide with the external verify levels, the same location is checked with the device in external mode. The result, whether pass or fail, is recorded on a map like that of FIG. 4.

At step 374, steps 368–372 are repeated until all 16 codes are tested. In step 376, the logged results are used to determine the optimum code for the verify charge pump 323, as described with respect to step 364.

Figure 3A:
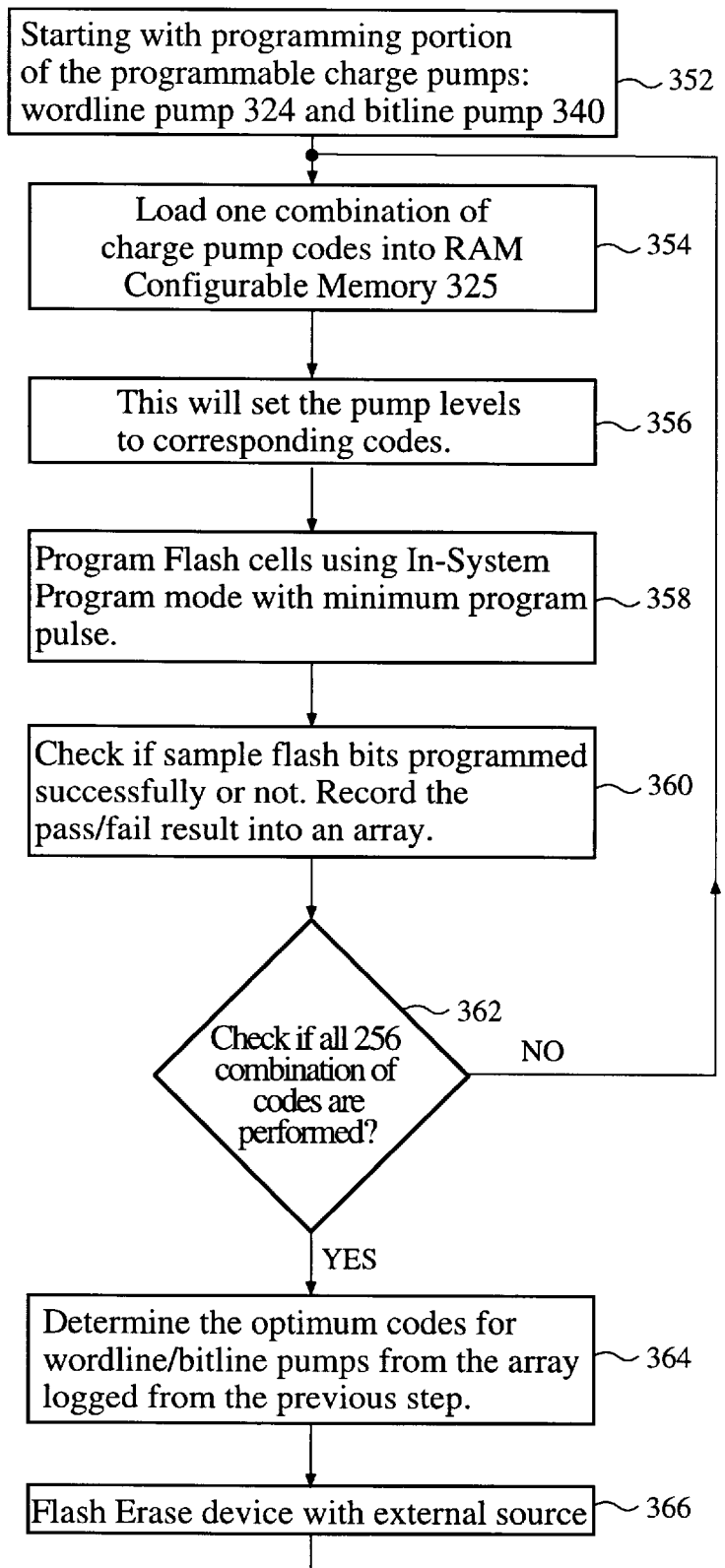
FIGS. 3A and 3B together show a flow diagram of the method of the present invention.
Figure 3B:
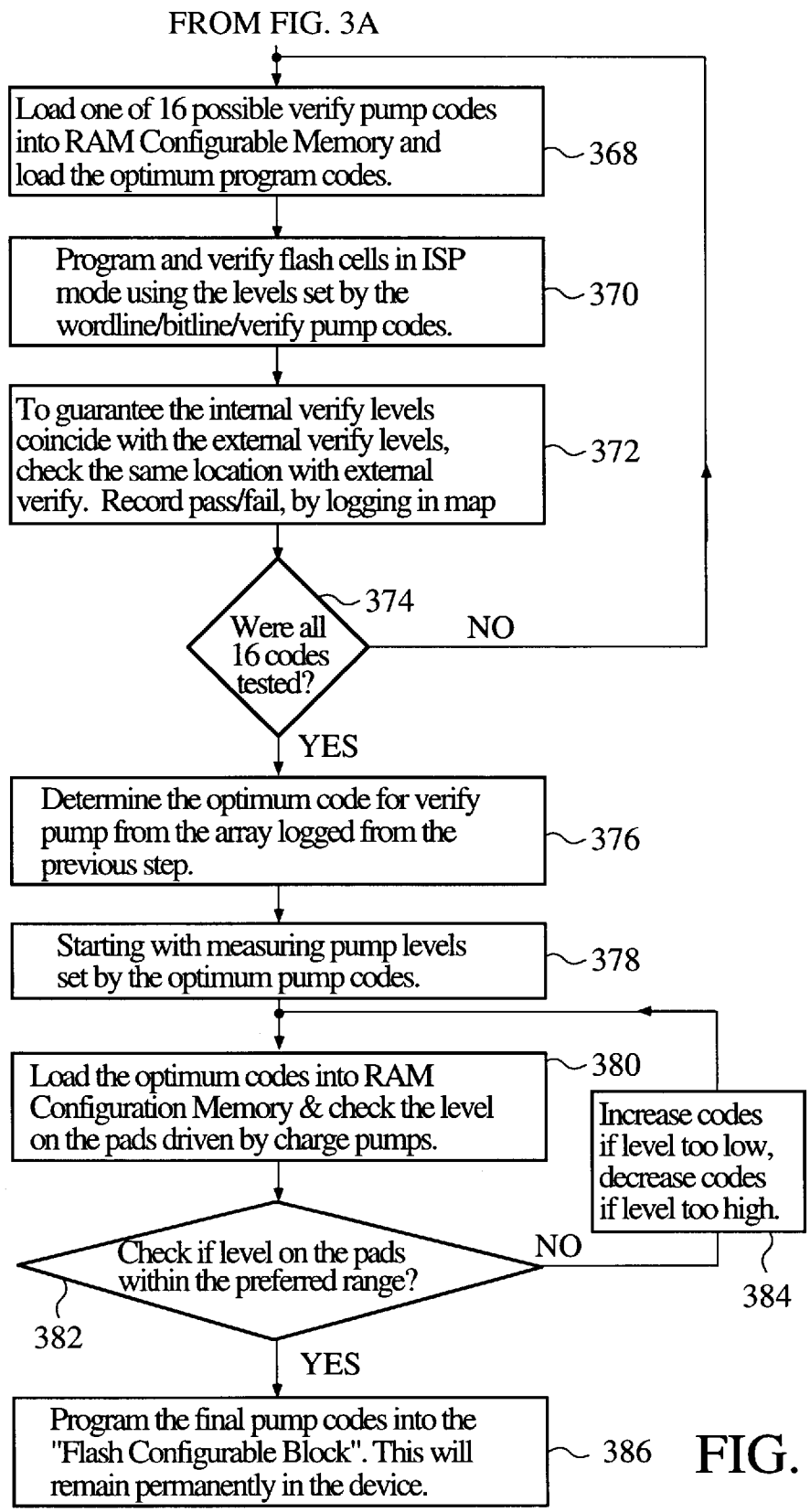
Figure 4:
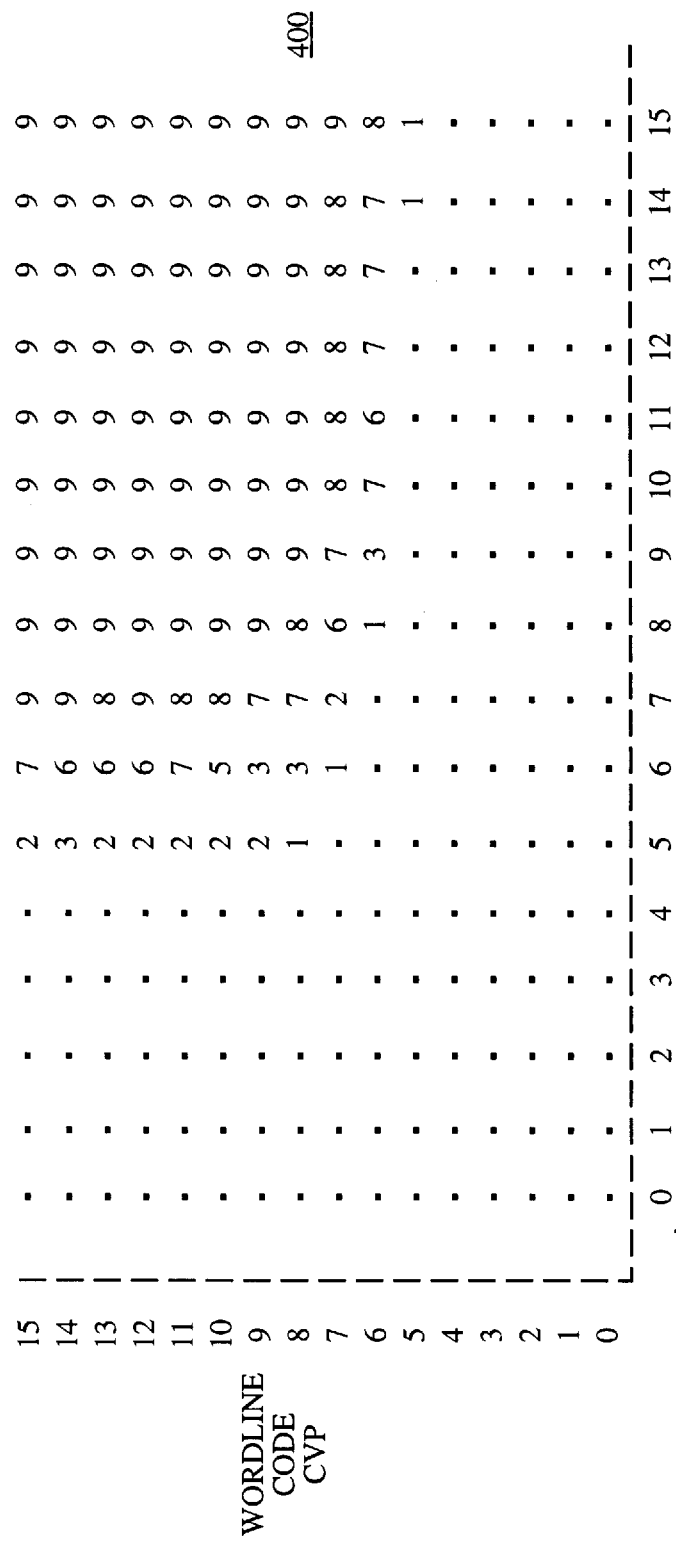
FIG. 4 illustrates a pass/fail array map for a batch of CPLDs tested in accordance with the present invention.

Although not shown in FIGS. 3A or 3B, the optimum erase pump code can be determined using a series of steps similar to those used in determining the optimum program pump code. First, the flash memory cells are programmed (if they are not already programmed), then various CVE codes are loaded into RAM configurable memory 325 and selected memory cells are erased. The erasure is then verified using the optimum verify voltage level. Test results are logged and the optimum erase pump code is determined as previously described for the other pump codes.

Optimization begins at step 378, by measuring charge pump levels set by the optimum pump codes determined in steps 364 and 376. At step 380, the optimum codes are loaded into RAM configuration memory 325 and the voltage levels on charge pump pads 341, 343, and 345 are checked. In step 382, if the levels on the pads are either too high or too low, the voltage levels are either increased (if too low) or decreased (if too high) at step 384, by increasing or decreasing the pump codes, and the levels on the pads are checked again. If the levels on the pads are within the desired range, then memory 325 is programmed at step 386 with the final, flash configurable codes.

Although the present invention has been shown and described with respect to preferred embodiments, various changes and modifications are deemed to lie within the spirit and scope of the invention as claimed. For example, the disclosed method may be implemented as an executable program by a central processing unit, or may be embedded in a dedicated processor, or otherwise implemented in a pure hardware environment as a firmware product. The corresponding structures, materials, acts, and equivalents of all means or step plus function elements in the claims which follow are intended to include any structure, material, or acts for performing the functions in combination with other claimed elements as specifically claimed.

What is claimed is:

1. A method of selecting optimum voltage levels for programming flash memory cells in a programmable integrated circuit (IC), the method comprising the steps of:
   a) selecting a wordline voltage level by setting a wordline pump code to one of a set of supported values;
   b) selecting a bitline voltage level by setting a bitline pump code to one of a set of supported values;
   c) programming selected flash memory cells using the selected wordline and bitline voltage levels;
   d) testing to see if the selected flash memory cells were successfully programmed, and logging test results;
   e) repeating steps a) through d) using other wordline and bitline pump codes; and
   f) determining the optimum wordline and bitline pump codes from the logged test results.

2. The method of claim 1, further comprising the steps of:
   g) setting the wordline and bitline pump codes to the optimum values; and
   h) reading the wordline and bitline voltage levels from internal test pads to verify that the voltage levels resulting from the optimum wordline and bitline pump codes fall within a preferred range.

3. The method of claim 1, further comprising the step of:
   g) programming the optimum wordline and bitline pump codes permanently into the programmable IC.

4. The method of claim 1, wherein in steps a) through e) the programmable IC is in In-System Programming (ISP) mode, the method further comprising the steps of:
   g) erasing the programmed flash memory cells;
   h) selecting a verify voltage level by setting a verify pump code to one of a set of supported values;
   i) programming selected flash memory cells using the selected wordline and bitline voltage levels;
   j) verifying the programmed flash memory cells using the selected verify voltage level, and logging verification results;
   k) repeating steps h) through j) using other verify pump codes;
   l) placing the programmable IC in external mode;
   m) verifying the programmed flash memory cells using an externally supplied verify voltage level, and logging verification results; and
   n) determining the optimum verify pump code from the logged verification results.

5. The method of claim 4, further comprising the steps of:
   o) setting the verify pump code to the optimum value; and
   p) reading the verify voltage level from an internal test pad to verify that the voltage level resulting from the optimum verify pump code falls within a preferred range.

6. The method of claim 4, further comprising the step of:
   o) programming the optimum verify pump code permanently into the programmable IC.

7. The method of claim 4, further comprising the steps of:
   o) selecting an erase voltage level by setting an erase pump code to one of a set of supported values;
   p) erasing selected flash memory cells using the selected erase voltage level;
   q) testing the erased flash memory cells and logging test results;
   r) repeating steps o) through q) using other erase pump codes;
   s) determining the optimum erase pump code from the logged test results.

8. The method of claim 7, further comprising the steps of:
   t) setting the erase pump code to the optimum value; and
   u) reading the erase voltage level from an internal test pad to verify that the voltage level resulting from the optimum erase pump code falls within a preferred range.

9. The method of claim 7, further comprising the step of:
   t) programming the optimum erase pump code permanently into the programmable IC.

10. The method of claim 1, further comprising the steps of:
    g) selecting an erase voltage level by setting an erase pump code to one of a set of supported values;
    h) erasing selected flash memory cells using the selected erase voltage level;
    i) testing the erased flash memory cells and logging test results;
    j) repeating steps g) through i) using other erase pump codes;
    k) determining the optimum erase pump code from the logged test results.

11. The method of claim 10, further comprising the steps of:
    l) setting the erase pump code to the optimum value; and
    m) reading the erase voltage level from an internal test pad to verify that the voltage level resulting from the optimum erase pump code falls within a preferred range.

12. The method of claim 10, further comprising the step of:
    l) programming the optimum erase pump code permanently into the programmable IC.

13. A method of selecting optimum voltage levels for verifying programming of flash memory cells in a programmable integrated circuit (IC), the method comprising the steps of:
    a) placing the programmable IC in In-System Programming (ISP) mode;
    b) selecting a verify voltage level by setting a verify pump code to one of a set of supported values;
    c) programming selected flash memory cells;
    d) verifying the programmed flash memory cells using the selected verify voltage level, and logging verification results;
    e) repeating steps b) through d) using other verify pump codes;
    f) placing the programmable IC in external mode;
    g) verifying the programmed flash memory cells using an externally supplied verify voltage level; and
    h) determining the optimum verify pump code from the logged verification results.

14. The method of claim 13, further comprising the steps of:
    i) setting the verify pump code to the optimum value; and
    j) reading the verify voltage level from an internal test pad to verify that the voltage level resulting from the optimum verify pump code falls within a preferred range.

15. The method of claim 13, further comprising the step of:
    i) programming the optimum verify pump code permanently into the programmable IC.

16. A method of selecting optimum voltage levels for erasing flash memory cells in a programmable integrated circuit (IC), the method comprising the steps of:
   a) selecting an erase voltage level by setting an erase pump code to one of a set of supported values;
   b) erasing selected flash memory cells using the selected erase voltage level;
   c) testing the erased flash memory cells and logging test results;
   d) repeating steps a) through c) using other erase pump codes;
   e) determining the optimum erase pump code from the logged test results.

17. The method of claim 16, further comprising the steps of:
   f) setting the erase pump code to the optimum value; and
   g) reading the erase voltage level from an internal test pad to verify that the voltage level resulting from the optimum erase pump code falls within a preferred range.

18. The method of claim 16, further comprising the step of:
   f) programming the optimum erase pump code permanently into the programmable IC.

19. A method of optimizing programming of CPLDs having flash memory arrays and charge pumps with programmable voltage levels, the method comprising the steps of:
   running each of the charge pumps through all combinations of voltage levels for programming and erase of the flash memory array;
   monitoring yield results for the flash memory array for each combination;
   selecting starting reference voltage levels based on the yield results;
   verifying actual voltage levels for the flash memory cells by using the starting reference voltage levels; and
   adjusting the voltage levels up or down if the verified levels are outside a desired range.

20. An automated test routine used to determine the optimum charge pump codes for use with a flash memory array in a CPLD, the codes determining a program voltage level for the CPLD, the method comprising the steps of:
   sequencing through all combinations of charge pump codes and attempting to program the flash memory array with each resulting program voltage level;
   logging the results of programming for each combination, the log being in the form of an array having a window of passing results;
   choosing the center of the window as a starting reference code;
   verifying an actual program voltage level associated with the starting reference code; and
   automatically adjusting the program voltage level towards a preferred range if the program voltage level does not fall into the preferred range.

21. An apparatus for selecting optimum voltage levels for programming flash memory cells in a programmable integrated circuit (IC), comprising:
   means for selecting a wordline voltage level by setting a wordline pump code to one of a set of supported values;
   means for selecting a bitline voltage level by setting a bitline pump code to one of a set of supported values;
   means for programming selected flash memory cells using the selected wordline and bitline voltage levels;
   means for testing to see if the selected flash memory cells were successfully programmed;
   means for logging test results; and
   means for determining the optimum wordline and bitline pump codes from the logged test results.

22. An apparatus for selecting optimum voltage levels for verifying programming of flash memory cells in a programmable integrated circuit (IC), comprising:
   means for placing the programmable IC in In-System Programming (ISP) mode;
   means for selecting a verify voltage level by setting a verify pump code to one of a set of supported values;
   means for programming selected flash memory cells;
   means for verifying the programmed flash memory cells using the selected verify voltage level, and logging verification results;
   means for placing the programmable IC in external mode;
   means for verifying the programmed flash memory cells using an externally supplied verify voltage level; and
   means for determining the optimum verify pump code from the logged verification results.

23. An apparatus for selecting optimum voltage levels for erasing flash memory cells in a programmable integrated circuit (IC), comprising:
   means for selecting an erase voltage level by setting an erase pump code to one of a set of supported values;
   means for erasing selected flash memory cells using the selected erase voltage level;
   means for testing the erased flash memory cells and logging test results; and
   means for determining the optimum erase pump code from the logged test results.

* * * * *